United States Patent
Han (10) Patent No.: US 8,872,250 B2
(45) Date of Patent: Oct. 28, 2014

(54) SEMICONDUCTOR DEVICE AND CAPACITOR

(75) Inventor: Kyoung Rok Han, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 107 days.

(21) Appl. No.: 13/602,064

(22) Filed: Aug. 31, 2012

(65) Prior Publication Data

US 2013/0087843 A1    Apr. 11, 2013

(30) Foreign Application Priority Data

Oct. 5, 2011    (KR) ........................ 10-2011-0101387

(51) Int. Cl.
| | |
|---|---|
| H01L 29/788 | (2006.01) |
| H01L 29/02 | (2006.01) |
| B82Y 10/00 | (2011.01) |
| H01L 21/28 | (2006.01) |
| H01L 29/423 | (2006.01) |
| H01L 27/115 | (2006.01) |
| H01L 49/02 | (2006.01) |

(52) U.S. Cl.
CPC ........... *B82Y 10/00* (2013.01); *H01L 21/28273* (2013.01); *H01L 29/42332* (2013.01); *H01L 29/7881* (2013.01); *H01L 29/7889* (2013.01); *H01L 27/11521* (2013.01); *H01L 27/11556* (2013.01); *H01L 28/60* (2013.01)
USPC .. 257/315; 257/532; 257/E29.3; 257/E29.002

(58) Field of Classification Search
USPC ...................... 257/315, 532, E29.3, E29.002
See application file for complete search history.

(56) References Cited

U.S. PATENT DOCUMENTS

| | | | |
|---|---|---|---|
| 7,928,500 B2 | 4/2011 | Sekine et al. | |
| 8,228,743 B2 * | 7/2012 | Min et al. ................. | 365/185.28 |

OTHER PUBLICATIONS

Ryuji Ohba, Yuichiro Mitani, Naoharu Sugiyama, Shinobu Fujita, Impact of Stoichiometry Control in Double Junction Memory on Future Scaling, IEEE International Electron Devices Meeting, IEDM technical digest, 50th annual meeting, San Francisco, CA, Dec. 13-15, 2004, 36.7.1-36.7.4, IEEE, Piscataway, NJ, ETATS-UNIS.

\* cited by examiner

*Primary Examiner* — Matthew W Such
*Assistant Examiner* — Monica D Harrison
(74) *Attorney, Agent, or Firm* — William Park & Associates Patent Ltd.

(57) ABSTRACT

The present invention relates to a semiconductor device including nanodots and a capacitor. A semiconductor device includes a channel layer, a tunnel insulating layer formed on the channel layer, a memory layer formed on the tunnel insulating layer and including first nanodots, a charge blocking layer formed on the memory layer, a gate electrode conductive layer formed on the charge blocking layer, and a buffer layer located, at least one of, inside the tunnel insulating layer, inside the charge blocking layer, at an interface between the tunnel insulating layer and the memory layer and at the interface between the charge blocking layer and the memory layer, wherein the buffer layer includes second nanodots.

19 Claims, 10 Drawing Sheets

SEMICONDUCTOR DEVICE AND CAPACITOR

CROSS-REFERENCE TO RELATED APPLICATION

The present application claims priority to Korean patent application number 10-2011-0101387 filed on Oct. 5, 2011, in the Korean Intellectual Property Office, the entire disclosure of which is incorporated by reference herein.

BACKGROUND

1. Field of Invention

Embodiments generally relate to a semiconductor device, a capacitor, and to a non-volatile memory device including nanodots and a capacitor.

2. Related Art

A non-volatile memory device can retain data stored therein even in the absence of a power supply. The non-volatile memory device, according to data storage methods, may be divided into a charge storage type and a charge trap type.

A floating gate type non-volatile memory device includes memory cells that comprise a tunnel insulating layer, a floating gate, a charge blocking layer and a control gate electrode stacked sequentially on a substrate. The floating gate type non-volatile memory is configured to store data by storing charges in a conduction band of the floating gate.

A charge trap type non-volatile memory device includes memory cells that comprise a tunnel insulating layer, a charge trap layer, a charge blocking layer, and a gate electrode stacked sequentially on a substrate. The charge trap type non-volatile memory device is configured to store data by trapping charges in deep level trap sites inside the charge trap layer.

A charge trap type non-volatile memory device is more appropriate for manufacturing a highly integrated memory device because it has little interference between neighboring memory cells, in comparison with a charge storage type non-volatile memory device. However, as for the above-described charge trap non-volatile memory device, trap sites are concentrated at the interface between the charge trap layer and the charge blocking layer, and the interface is unstable, which may cause an unstable program/erase operation of the memory device and charge loss. In particular, during an erase operation, charges may be introduced into the charge trap layer from the control gate through the charge blocking layer, which may cause a reduction in erase speed.

To overcome these disadvantages, a non-volatile memory device that stores charges by using nanodots has been developed. However, data retention characteristics of a non-volatile memory device that includes nanodots may be deteriorated as charges are drained off to the nanodots with a reduction in cell area caused by a higher integration degree of a semiconductor device. In addition, a range of threshold voltage variations of the memory cells may not be wide enough during an erase operation.

Meanwhile, a capacitor used in a semiconductor device comprises a lower electrode, a dielectric layer, and an upper electrode stacked on and upon another in a sequential manner and functions to store charges. However, a higher integration degree of a semiconductor device may cause a reduction in cell area. As a result, capacitance of the capacitor may be reduced, and charges stored in the capacitor may be drained off.

BRIEF SUMMARY

An embodiment relates to a non-volatile memory device including nanodots and a capacitor.

A semiconductor device according to an embodiment includes a channel layer, a tunnel insulating layer formed on the channel layer, a memory layer formed on the tunnel insulating layer and including first nanodots, a charge blocking layer formed on the memory layer, a gate electrode conductive layer formed on the charge blocking layer, and a buffer layer located, at least one of, inside the tunnel insulating layer, inside the charge blocking layer, at an interface between the tunnel insulating layer and the memory layer and at the interface between the charge blocking layer and the memory layer, wherein the buffer layer includes second nanodots.

A semiconductor device according to another embodiment includes conductive layers and interlayer insulating layers stacked alternately on a substrate, semiconductor pillars protruding from the substrate and passing through the conductive layers, a memory layer substantially surrounding sidewalls of the semiconductor pillars and including first nanodots, a tunnel insulating layer interposed between the semiconductor pillars and the memory layer, a charge blocking layer interposed between the memory layer and the conductive layers, and a buffer layer located, at least one of, inside the tunnel insulating layer, inside the charge blocking layer, at the interface between the tunnel insulating layer and the memory layer, and at the interface between the charge blocking layer and the memory layer, wherein the buffer layer includes second nanodots.

A semiconductor device according to yet another embodiment includes a channel structure including semiconductor layers and interlayer insulating layers stacked alternately, a memory layer formed substantially on sidewalls of the channel structure and including first nanodots, a conductive layer formed on the memory layer, a tunnel insulating layer interposed between the sidewalls of the channel structure and the memory layer, a charge blocking layer interposed between the memory layer and the conductive layer, and a buffer layer located, at least one of, inside the tunnel insulating layer, inside the charge blocking layer, at an interface between the tunnel insulating layer and the memory layer, and at an interface between the charge blocking layer and the memory layer, wherein the buffer layer includes second nanodots.

A capacitor according to further another embodiment includes an upper electrode, a lower electrode, a dielectric layer interposed between the upper electrode and the lower electrode and including first nanodots, and a buffer layer located, at least one of, at an interface between the lower electrode and the dielectric layer, and at an interface between the upper electrode and the dielectric layer, wherein the buffer layer includes second nanodots.

DETAILED DESCRIPTION

Hereinafter, various embodiments of the present disclosure will be described in detail with reference to the accompanying drawings. The drawings are not necessarily to scale and in some instances, proportions may have been exaggerated in order to clearly illustrate features of the embodiments. Moreover, detailed descriptions related to well-known functions or configurations will be ruled out in order not to unnecessarily obscure subject matters of the embodiments. In the drawings, like reference numerals refer to like elements throughout.

Figure 1A:
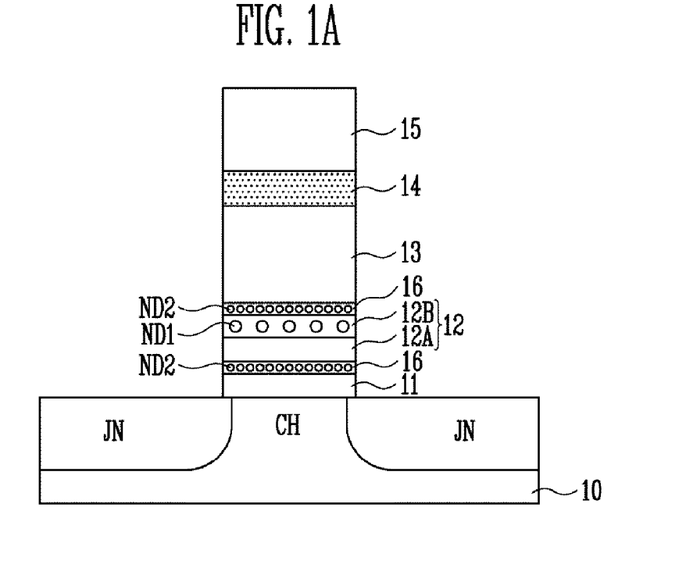
FIG. 1A is a cross-sectional view illustrating a structure of a non-volatile memory device according to an embodiment.
Figure 1B:
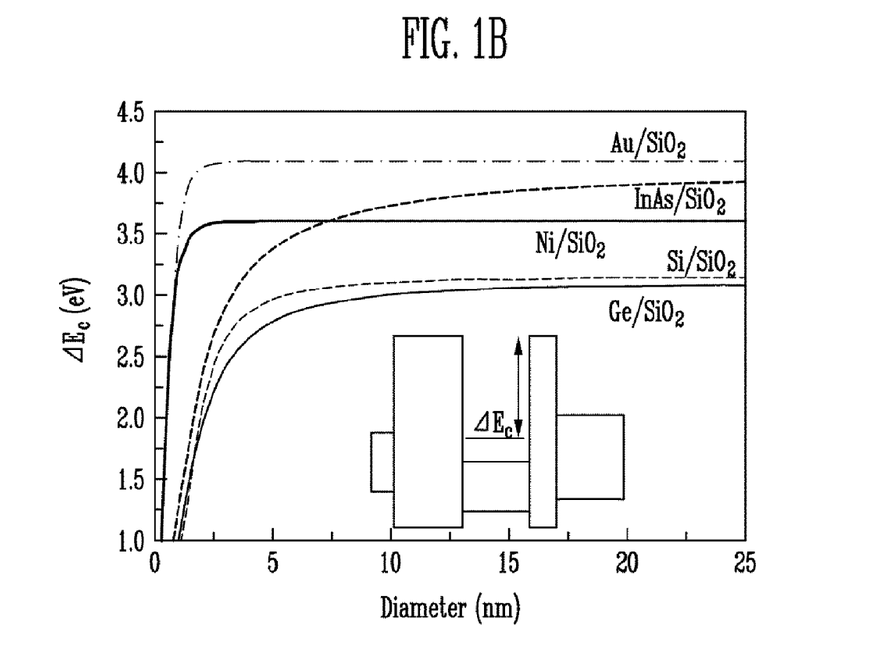
FIG. 1B is a graph illustrating the change in band offset according to the diameter of the nanodots.

FIG. 1A is a cross-sectional view illustrating a structure of a non-volatile memory device according to an embodiment. FIG. 1B is a graph illustrating the change in band offset depending on the nanodot diameter.

Referring to FIG. 1A, a semiconductor device, particularly the non-volatile memory device according to an embodiment may include; a channel layer CH, a tunnel insulating layer 11 formed on the channel layer CH, a memory layer 12 formed over the tunnel insulating layer 11 and including first nanodots ND1, a charge blocking layer 13 formed over the memory layer 12, and a gate electrode conductive layer (hereinafter, referred to as a "gate electrode 15") formed over the charge blocking layer 13. The memory device may further include a buffer layer 16. The buffer layer 16, may be located, at least one of; inside the tunnel insulating layer 11, inside the charge blocking layer 13, at the interface between the tunnel insulating layer 11 and the memory layer 12, and at the interface between the charge blocking layer 13 and the memory layer 12. In addition, the buffer layer 16 may include second nanodots ND2.

FIG. 1A illustrates a cross-section of a planar non-volatile memory device that comprises the tunnel insulating layer 11, the memory layer 12, the charge blocking layer 13, and the gate electrode 15 sequentially stacked on a substrate 10. Additionally, referring to FIG. 1A, the buffer layer 16 may be interposed at the interface between the tunnel insulating layer 11 and the memory layer 12 and at the interface between the memory layer 12 and the charge blocking layer 13. The memory layer 12 comprises a dual layer (12A and 12B), junctions JN substantially symmetrical to each other may be formed at both ends of a gate pattern inside the substrate 10. A barrier layer 14 may be interposed between the charge blocking layer 13 and the gate electrode 15.

The tunnel insulating layer 11 may be provided as an energy barrier layer for Fowler-Nordheim (F-N) tunneling of charges. The tunnel insulating layer 11 may comprise a single layer or multiple layers having a plurality of layers stacked one upon another. When the tunnel insulating layer 11 comprises multiple layers, the tunnel insulating layer 11 may be formed by stacking materials having different dielectric constants or band gaps.

For example, the tunnel insulating layer 11 may be formed of one of $SiO_2$, $Si_xN_y$, a metal oxide and a high-k material, or any suitable combination of these materials. In addition, the tunnel insulating layer 11 may have a thickness ranging from about 1 to 10 nm.

The memory layer 12 may be formed to store data by injecting/emitting charges. Charges may be injected into or emitted particularly from the first nanodots ND1 included in the memory layer 12. The first nanodots ND1 may function as the actual data storage that stores data therein.

The memory layer 12 may be formed of one of silicon nitride ($Si_xN_y$, a metal oxide and a high-k material, or any suitable combination of these materials. In addition, the memory layer 12 may comprise a single layer or multiple layers having a plurality of layers stacked one upon another. When the memory layer 12 comprises multiple layers, the first nanodots ND1 may be included in at least one of the multiple layers.

In an embodiment, the memory layer 12 comprises the dual layer (12A and 12B), and a second memory layer 12B alone includes the first nanodots ND1. For example, a first memory layer 12A may comprise a silicon nitride (SiN) layer, and the second memory layer 12B may comprise a silicon nitride (SiN) layer including the first nanodots ND1. In another example, the first memory layer 12A may be formed of a nitride layer (Si-Rich Nitride) having a high silicon content, and the second memory layer 12B may comprise a silicon nitride (SiN) layer including the first nanodots ND1.

Preferably, the first nanodots ND1 may be formed of a material having a high work function and a high band offset with the tunnel insulating layer 11. For example, the first nanodots ND1 may be formed of one of a semiconductor, a metal oxide, a metal and a silicide, or any suitable combination of these materials. In addition, each of the first nanodots ND1 may have a diameter ranging from about 1 to 10 nm.

The charge blocking layer 13 may prevent charges stored in the memory layer 12 from moving to the gate electrode 15. The charge blocking layer 13 may comprise a single layer or multiple layers having a plurality of layers stacked one upon another. When the charge blocking layer 13 comprises multiple layers, the charge blocking layer 13 may be formed by stacking materials having different dielectric constants or band gaps.

For example, the charge blocking layer 13 may be formed of one of $SiO_2$, $Si_xN_y$, a metal oxide and a high-k material, or any suitable combination of these materials. In addition, the charge blocking layer 13 may have a thickness between about 1 and 20 nm.

The gate electrode 15 may be formed of a conductive layer such as a polysilicon layer, a tungsten layer, or a silicide layer. Alternatively, the gate electrode 15 may be formed by stacking one or more material layers.

The buffer layer 16 may prevent damage to data stored in the memory cells due to unexpected movement of charges, for example, when the charges stored in the memory layer 12 are drained off. The movement of the charges may be blocked by the second nanodots ND2 included in the buffer layer 16.

Preferably, the second nanodots ND2 may be formed of a material having a high band offset with the tunnel insulating layer 11 or the charge blocking layer 13. For example, the second nanodots ND2 may be formed of one of a semiconductor, a metal oxide, metals and a silicide, or a combination thereof. Preferably, the second nanodots ND2 may be formed of a metal having an advantage in forming small-sized nanodots. In addition, preferably, each of the second nanodots ND2 may have a smaller size than each of the first nanodots ND1 and have a diameter ranging from about 0.1 to 3 nm.

The principles of the buffer layer 16 will be described with reference to FIG. 1B. In FIG. 1B, the x-axis represents the nanodots diameter (diameter), and the y-axis represents the band offset difference ($\Delta E_c$) between the second nanodots ND2 and the insulating layer (charge blocking layer 13 or tunnel insulating layer 11) adjoining the buffer layer 16.

When quantum wells of nanodots are filled with charges, energy levels increase by quantum effects. A graph of FIG. 1B illustrates the band offset difference ($\Delta E_c$) between nanodots (Au, InAs, Ni, Si, and Ge) and an insulating layer ($SiO_2$) when energy levels increase since quantum wells of the nanodots (Au, InAs, Ni, Si, and Ge) are filled with charges.

In the graph of FIG. 1B, it is illustrated that the band offset difference ($\Delta E_c$) drastically decreases when the nanodot diameter is reduced to 3 nm or less. That is, as the band offset difference ($\Delta E_c$) is smaller, the charge storage capability of nanodots is reduced. Thus, nanodots each having a diameter of 3 nm or less may store very low amounts of charge.

Therefore, the buffer layer 16 including the second nanodots ND2 may serve as a barrier layer that blocks the movements of the charges.

In an example, the buffer layer 16, located, at least one of; inside the charge blocking layer 13, and at the interface between the charge blocking layer 13 and the memory layer 12, may block movements of charges under low-field conditions or high-field conditions. Here, high-field conditions may refer to conditions under which an electric field having a relatively high level is applied to the buffer layer 16, such as a program operation or an erase operation. Low-field conditions may refer to conditions under which an electric field having a relatively low level is applied to the buffer layer 16, such as a read operation during which a relatively low voltage is applied, or retention conditions under which stored data is maintained.

In another example, the buffer layer 16, located, at least one of; inside the tunnel insulating layer 11, and at the interface between the tunnel insulating layer 11 and the memory layer 12, may block the charges stored in the memory layer 12 from being drained off under low-field conditions.

Therefore, the buffer layer 16, may be located, at least one of; inside the tunnel insulating layer 11, inside the charge blocking layer 13, at the interface between the tunnel insulating layer 11 and the memory layer 12, and at the interface between the charge blocking layer 13 and the memory layer 12, to thus improve retention characteristics of the memory device.

Figure 2A:
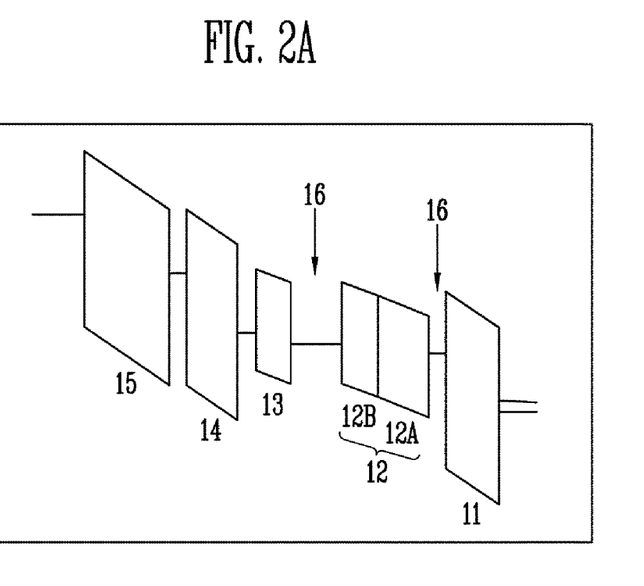
FIGS. 2A and 2B are band diagrams of layers during an erase operation of the non-volatile memory device according to an embodiment.
Figure 2B:
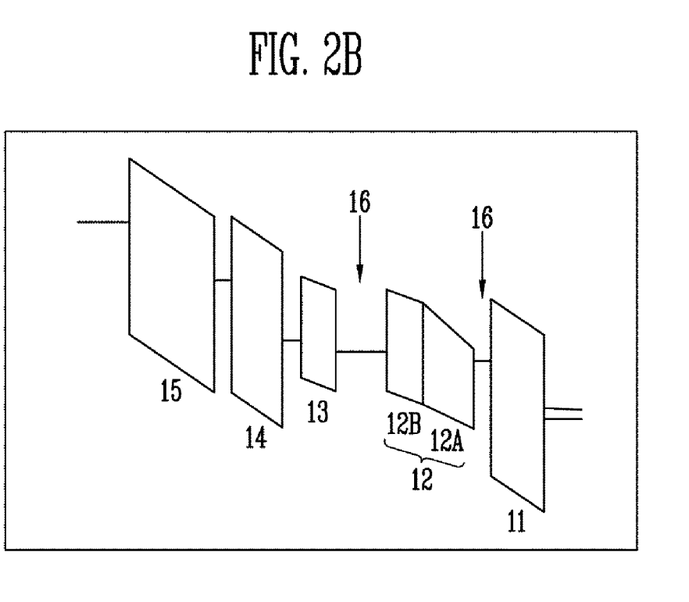

FIGS. 2A and 2B are band diagrams of layers during an erase operation of the non-volatile memory device according to an embodiment.

FIG. 2A illustrates an example where the first memory layer 12A and the second memory layer 12B each comprise a silicon nitride (SiN) layer. In addition, FIG. 2B illustrates an example where the first memory layer 12A comprises a nitride layer having a high silicon content (Si-Rich Nitride) and the second memory layer 12B comprises a silicon nitride (SiN) layer.

The memory layer 12 may comprise multiple layers, and the first memory layer 12A comprising the silicon nitride (SiN) layer may be located under the second memory layer 12B including the second nanodots ND2 to thus improve the erase operation of the memory device. Additionally, when the first memory layer 12A comprises a nitride layer having a high silicon content (Si-Rich Nitride), an erase operation may be more efficiently performed since the nitride layer having a high silicon content (Si-Rich Nitride) has a smaller band gap energy than the silicon nitride (SiN) layer.

Figure 3A:
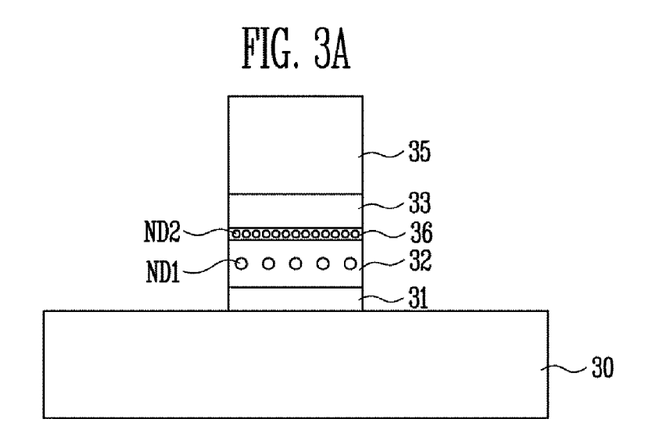
FIG. 3A is a cross-sectional view of a non-volatile memory device according to an embodiment.

FIG. 3A is a cross-sectional view illustrating a non-volatile memory device according to an embodiment.

Referring to FIG. 3A, the non-volatile memory device according to an embodiment may include a buffer layer 36 including the second nanodots ND2. The buffer layer 36 may be interposed between a memory layer 32 and a charge blocking layer 33.

A tunnel insulating layer 31, the memory layer 32 including the first nanodots ND1, the buffer layer 36 including the second nanodots ND2, the charge blocking layer 33 and a gate electrode 35 may be stacked sequentially on a substrate 30.

With the above-described structure, the buffer layer 36 may block movements of charges under high-field conditions or low-field conditions. For example, the buffer layer 36 may block charges stored in the memory layer 32 from being drained off to the gate electrode 35 or charges on the gate electrode 35 from being introduced into the memory layer 32.

Figure 3B:
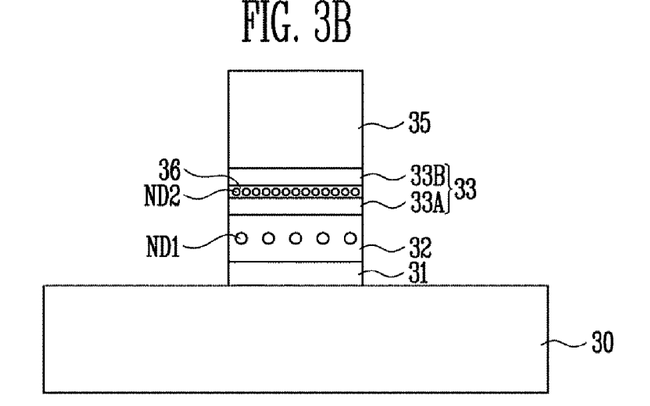
FIG. 3B is a cross-sectional view of a non-volatile memory device according to an embodiment.

FIG. 3B is a cross-sectional view of a non-volatile memory device according to an embodiment.

As illustrated in FIG. 3B, the non-volatile memory device according to an embodiment may include the buffer layer 36 that may be located in the charge blocking layer 33 and include the second nanodots ND2.

Therefore, the tunnel insulating layer 31, the memory layer 32 including the first nanodots ND1, a first charge blocking layer 33A, the buffer layer 36 including the second nanodots ND2, a second charge blocking layer 33B, and the gate electrode 35 may be stacked sequentially on the substrate 30.

With the above-described structure, the buffer layer 36 may block movements of charges under high-field conditions and low-field conditions. For example, the buffer layer 36 may block the charges stored in the memory layer 32 from being drained off to the gate electrode 35 or the charges on the gate electrode 35 from being introduced into the memory layer 32.

Figure 4A:
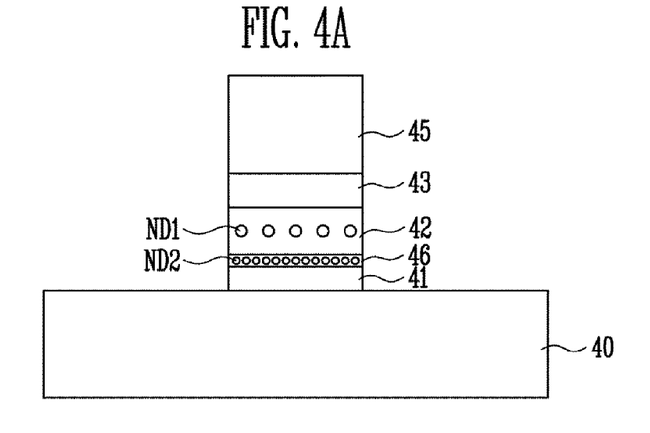
FIG. 4A is a cross-sectional view of a non-volatile memory device according to an embodiment.

FIG. 4A is a cross-sectional view of a non-volatile memory device according to an embodiment.

As illustrated in FIG. 4A, the non-volatile memory device according to an embodiment may include a buffer layer 46 that may be interposed between a memory layer 42 and a tunnel insulating layer 41 and include the second nanodots ND2.

Therefore, the tunnel insulating layer 41, the buffer layer 46 including the second nanodots ND2, the memory layer 42 including the first nanodots ND1, a charge blocking layer 43, and a gate electrode 45 may be stacked sequentially on a substrate 40.

With the above-described structure, the buffer layer 46 may block movements of charges under low-field conditions. For example, the buffer layer 46 may block the charges stored in the memory layer 42 from being drained off to a channel layer.

Figure 4B:
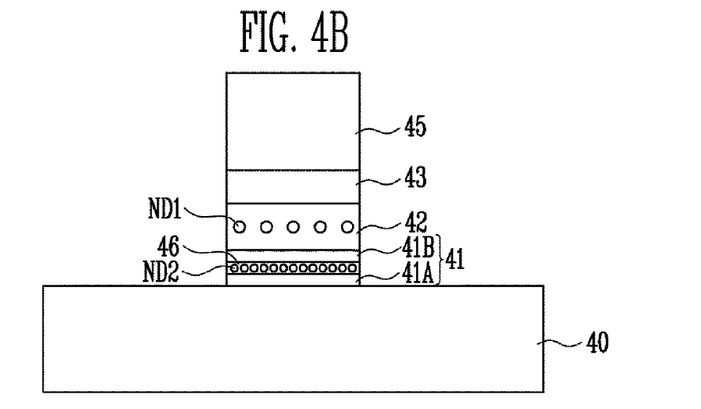
FIG. 4B is a cross-sectional view of a non-volatile memory device according to an embodiment.

FIG. 4B is a cross-sectional view of a non-volatile memory device according to an embodiment.

As illustrated in FIG. 4B, the non-volatile memory device according to an embodiment may include the buffer layer 46 that may be located in the tunnel insulating layer 41 and include the second nanodots ND2.

Therefore, a first tunnel insulating layer 41A, the buffer layer 46, a second tunnel insulating layer 41B, the memory layer 42 including the first nanodots ND1, the charge blocking layer 43 and the gate electrode 45 may be stacked sequentially on the substrate 40.

With the above-described structure, the buffer layer 46 may block movements of charges under low-field conditions. For example, the buffer layer 46 may block the charges stored in the memory layer 42 from being drained off to a channel layer in a retention mode.

Additionally, the embodiments associated with FIGS. 3A to 4B are described in connection with different drawings from each other in the specification. However, the embodiments are not limited thereto. As the embodiments associated with FIGS. 3A to 4B may be realized in combination with each other.

Figure 5A:
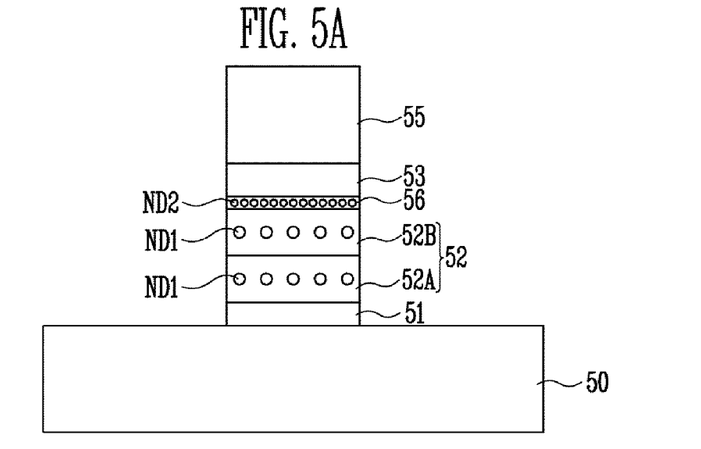
FIG. 5A is a cross-sectional view of a non-volatile memory device according to an embodiment.

FIG. 5A is a cross-sectional view of a non-volatile memory device according to an embodiment.

As illustrated in FIG. 5A, the non-volatile memory device according to an embodiment may include a buffer layer 56. The buffer layer 56 may be located, at least one of; inside a tunnel insulating layer 51, inside a charge blocking layer 53, at the interface between the tunnel insulating layer 51 and a memory layer 52, and at the interface between the charge blocking layer 53 and the memory layer 52. In addition, the buffer layer 56 may include the second nanodots ND2. Here, the memory layer 52 may comprise multiple layers.

In FIG. 5A, the tunnel insulating layer 51, a first memory layer 52A including the first nanodots ND1, a second memory layer 52B including the first nanodots ND1, the buffer layer 56 including the second nanodots ND2, the charge blocking layer 53 and a gate electrode 55 may be stacked sequentially on a substrate 50.

According to the above-described structure, the memory layer 52 may comprise multiple layers, and at least one memory layer (52A or 52B) may include the first nanodots ND1, thereby enhancing the charge storage capability of the memory layer 52.

Also, in an embodiment, the memory layer 52 comprising multiple layers may be used in the above-described memory device according to an embodiment associated with, for example, FIG. 3A. However, an embodiment is not limited thereto. For example, the memory layer 52 comprising multiple layers may be used in one of the embodiments associated with, for example, FIGS. 3A to 5A, or any suitable combination of these embodiments.

Figure 5B:
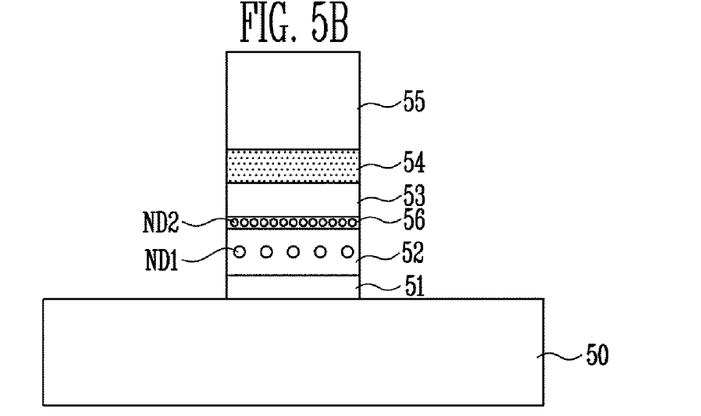
FIG. 5B is a cross-sectional view of a non-volatile memory device according to an embodiment.

FIG. 5B is a cross-sectional view of a non-volatile memory device according to an embodiment.

As illustrated in FIG. 5B, the non-volatile memory device according to an embodiment may include the buffer layer 56. The buffer layer 56 may be located, at least one of; inside the tunnel insulating layer 51, inside the charge blocking layer 53, at the interface between the tunnel insulating layer 51 and the memory layer 52, and at the interface between the charge blocking layer 53 and the memory layer 52. In addition, the buffer layer 56 may include the second nanodots ND2. Here, barrier layer 54 may be interposed between the charge blocking layer 53 and the gate electrode 55.

Referring to FIG. 5B, the tunnel insulating layer 51, the memory layer 52 including the first nanodots ND1, the buffer layer 56 including the second nanodots ND2, the charge blocking layer 53, the barrier layer 54 and the gate electrode 55 may be stacked sequentially on the substrate 50.

According to the above-described structure, the barrier layer 54 may be interposed between the charge blocking layer 53 and the gate electrode 55, so that the charges stored in the memory layer 52 may be efficiently blocked from being drained off to the gate electrode 55.

Meanwhile, in an embodiment associated with FIG. 5B, the barrier layer 54 may be used in the above-described memory device according to an embodiment associated with, for example, FIG. 3A. However, the present invention is not limited thereto. For example, the barrier layer 54 may also be used in one of the embodiments associated with, for example, FIGS. 3A to 5B, or any suitable combination of these embodiments.

Figure 5C:
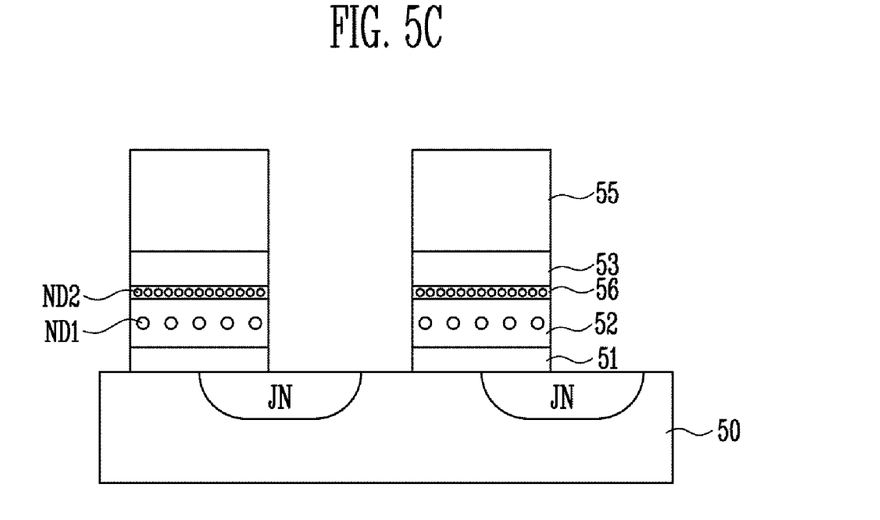
FIG. 5C is a cross-sectional view of a non-volatile memory device according to an embodiment.

FIG. 5C is a cross-sectional view of a non-volatile memory device according to an embodiment.

As illustrated in FIG. 5C, the non-volatile memory device according to an embodiment may include the buffer layer 56. The buffer layer 56 may be located, at least one of; inside the tunnel insulating layer 51, inside the charge blocking layer 53, at the interface between the tunnel insulating layer 51 and the memory layer 52, and at the interface between the charge blocking layer 53 and the memory layer 52. In addition, the buffer layer 56 may include the second nanodots ND2. The non-volatile memory device according to an embodiment may include junctions JN symmetrical to each other, junctions JN that are asymmetrical, relative to each other, in the substrate 50, or may not include the junctions JN.

As illustrated in FIG. 5C, the tunnel insulating layer 51, the memory layer 52 including the first nanodots ND1, the buffer layer 56 including the second nanodots ND2, the charge blocking layer 53, and the gate electrode 55 may be stacked sequentially on the substrate 50. Additionally, the asymmetrical junctions JN may be formed in the substrate 50.

Also, in an embodiment, the symmetrical junctions JN or the asymmetrical junctions JN may be used in the above-described memory device according to an embodiment associated with, for example, FIG. 3A. However, the embodiments are not limited thereto. For example, the symmetrical junctions JN or the asymmetrical junctions JN may be used in one of the embodiments associated with, for example, FIGS. 3A to 5C, or any suitable combination of these embodiments.

Figure 5D:
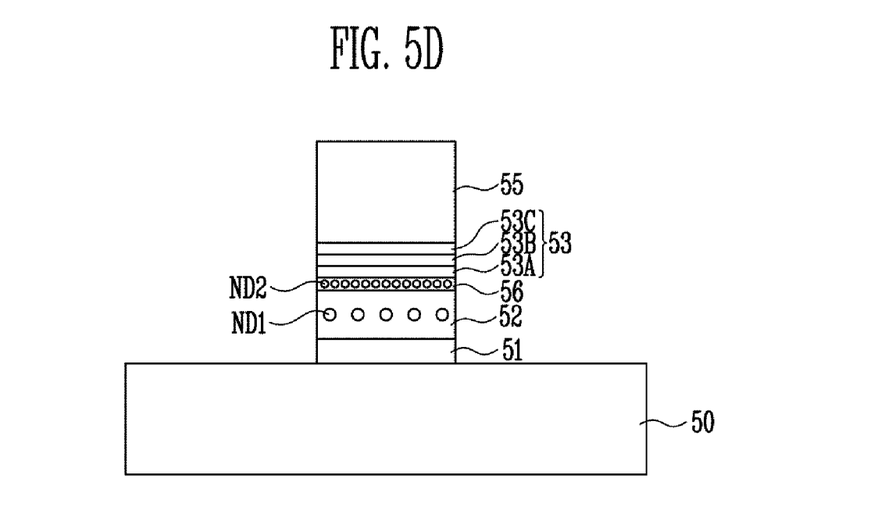
FIG. 5D is a cross-sectional view of a non-volatile memory device according to an embodiment.

FIG. 5D is a cross-sectional view of a non-volatile memory device according to an embodiment.

As illustrated in FIG. 5D, the non-volatile memory device according to an embodiment may include the buffer layer 56. The buffer layer 56 may be located, at least one of; inside the tunnel insulating layer 51, inside the charge blocking layer 53, at the interface between the tunnel insulating layer 51 and the memory layer 52, and the interface between the charge blocking layer 53 and the memory layer 52. In addition, the buffer layer 56 may include the second nanodots ND2. Here, the charge blocking layer 53 may comprise multiple layers.

As illustrated in FIG. 5D, the tunnel insulating layer 51, the memory layer 52 including the first nanodots ND1, the buffer layer 56 including the second nanodots ND2, a first charge blocking layer 53A, a second charge blocking layer 53B, a third charge blocking layer 53C, and the gate electrode 55 may be stacked sequentially on the substrate 50.

In an example, the first charge blocking layer 53A and the third charge blocking layer 53C may be formed of one of $SiO_2$, $Si_xN_y$, a metal oxide and a high-k material, or any suitable combination of these materials. The second charge blocking layer 53B may comprise a silicon nitride (SiN) layer.

According to the above-described structure, the silicon nitride (SiN) layer may be located in the charge blocking layer 53 to thus effectively block the charges stored in the memory layer 52 from being drained off to the gate electrode 55.

Additionally, in an embodiment, the charge blocking layer 53 comprising multiple layers may be used in the above-described memory device according to an embodiment associated with, for example, FIG. 3A. However, the embodiments are not limited thereto. For example, the charge blocking layer 53 comprising multiple layers may be used in one of the embodiments associated with, for example, 3A to 5D, or any suitable combination of these embodiments.

Figure 6A:
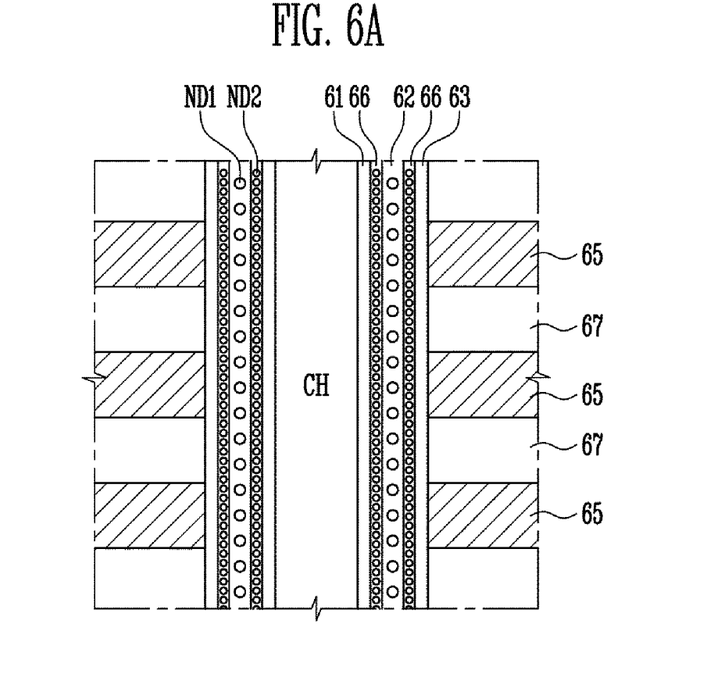
FIG. 6A is a cross-sectional view illustrating a structure of a non-volatile memory device according to an embodiment.

FIG. 6A is a cross-sectional view illustrating a structure of a non-volatile memory device according to an embodiment. In FIG. 6A, a portion of a memory cell region is depicted for illustration purposes.

As illustrated in FIG. 6A, a semiconductor device, particularly the non-volatile memory device according to an embodiment may include; conductive layers and interlayer insulating layers 67 stacked alternately on a substrate (not illustrated), semiconductor pillars protruding from the substrate and passing through the conductive layers and the interlayer insulating layers 67, memory layers 62 substantially surrounding the semiconductor pillars, respectively, tunnel insulating layers 61 interposed between the semiconductor pillars and the memory layers 62, and charge blocking layers 63 interposed between the semiconductor pillars and the conductive layers. Here, the conductive layers may be used as word lines or selection lines, and the semiconductor pillars may be used as channel layers. Hereinafter, an example will be described below in which the conductive layers serves as word lines 65 and the semiconductor pillar serves as the channel layer CH.

The non-volatile memory device according to an embodiment may further include a buffer layer 66. The buffer layer 66 may be located, at least one of; inside the tunnel insulating layer 61, inside the charge blocking layer 63, at the interface between the tunnel insulating layer 61 and the memory layer 62, and at the interface between the charge blocking layer 63 and the memory layer 62. In addition, the buffer layer 66 may include the second nanodots ND2.

As described above in the embodiments associated with, for example, FIGS. 5A to 5D, the memory layer 62 may comprise multiple layers while one of the multiple layers may include the first nanodots ND1, a barrier layer may further be included, symmetrical junctions or asymmetrical junctions may be included, any junction may not be included, or the charge blocking layer 63 may comprise multiple layers. Also, the embodiments associated with, for example, FIGS. 3A to 6A may be combined with each other.

A process of manufacturing the non-volatile memory device according to an embodiment associated with FIG. 6A will be described below.

In an example, the plurality of interlayer insulating layers 67 and the plurality of word lines 65 may be arranged alternately on the substrate and etched to form a trench. Subsequently, the charge blocking layer 63, the buffer layer 66, the memory layer 62, the buffer layer 66, and the tunnel insulating layer 61 may be formed sequentially on an inner wall of the trench. Next, the channel layer CH may be formed on the tunnel insulating layer 61. Subsequently, the plurality of interlayer insulating layers 67 and the plurality of word lines 65 may be etched to form a slit. The plurality of word lines 65 exposed along an inner wall of the slit may be silicided, and the slit may be filled with an insulating layer. In this manner, a three-dimensional structured non-volatile memory device including nanodots may be manufactured.

In another example, after the plurality of interlayer insulating layers 67 and a plurality of sacrificial layers are formed alternately on the substrate, the insulating layers 67 and the sacrificial layers may be etched to form a trench. Here, the interlayer insulating layer 67 may comprise an oxide layer, and the sacrificial layer may comprise a nitride layer. Subsequently, the charge blocking layer 63, the buffer layer 66, the memory layer 62, the buffer layer 66, and the tunnel insulating layer 61 may be formed sequentially on an inner wall of the trench. Next, the channel layer CH may be formed on the tunnel insulating layer 61.

Subsequently, the plurality of interlayer insulating layers 67 and the plurality of sacrificial layers may be etched to form a slit between neighboring channel layers CH, and the plurality of sacrificial layers exposed through the slit may be recessed. After the word lines 65 are formed by filling recessed regions of the plurality of scarification layers with conductive layers, an insulating layer may be formed in the slit. In this manner, a three-dimensional structured non-volatile memory device including nanodots may be manufactured.

In yet another example, after the plurality of word lines 65 and the plurality of sacrificial layers are formed alternately on the substrate, the plurality of word lines 65 and the plurality of sacrificial layers may be etched to form a trench. Here, the word lines 65 each may be formed of a doped polysilicon layer doped with impurities such as boron (Br), and the sacrificial layer may be formed of an undoped polysilicon layer or an undoped amorphous silicon layer which is not doped with an impurity.

Subsequently, the charge blocking layer 63, the buffer layer 66, the memory layer 62, the buffer layer 66, and the tunnel insulating layer 61 may be formed sequentially on an inner wall of the trench. Next, the channel layer CH may be formed on the tunnel insulating layer 61. Subsequently, the plurality of word lines 65 and the plurality of sacrificial layers may be etched to form a slit between neighboring channel layers CH, and the plurality of sacrificial layers exposed through the slit may be recessed. The interlayer insulating layers 67 may then be formed in recessed regions of the plurality of sacrificial layers and the slit. In this manner, a three-dimensional structured non-volatile memory device including nanodots may be manufactured.

Figure 6B:
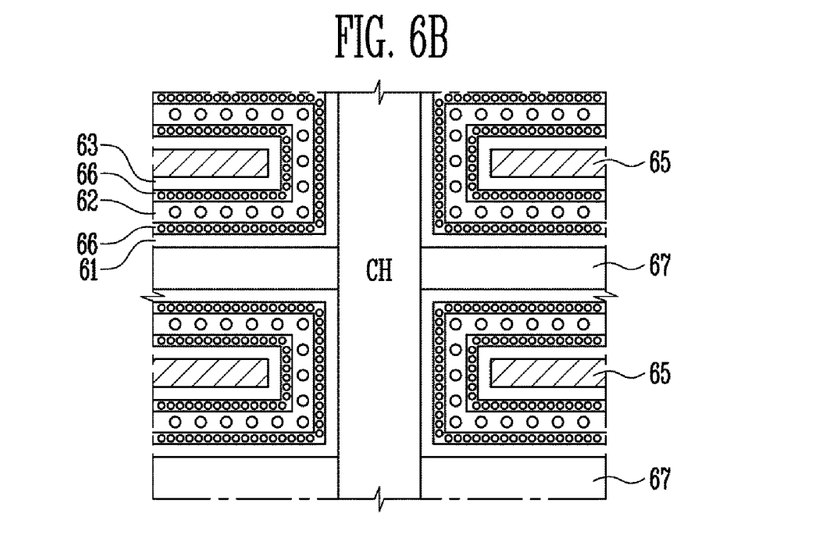
FIG. 6B is a cross-sectional view illustrating a structure of a non-volatile memory device according to an embodiment.

FIG. 6B is a cross-sectional view illustrating a structure of a non-volatile memory device according to an embodiment. In FIG. 6B, a portion of a memory cell region is depicted for illustration purposes.

As illustrated in FIG. 6B, the non-volatile memory device according to an embodiment may include; the plurality of word lines 65 and the plurality of interlayer insulating layers 67 stacked alternately on a substrate (not illustrated), the channel layer CH passing through the plurality of word lines 65 and the plurality of interlayer insulating layers 67 and protruding from the substrate, the charge blocking layer 63 interposed between the plurality of word lines 65 and the channel layer CH, and between the plurality of word lines 65 and the plurality of interlayer insulating layers 67, and substantially surrounding the word lines 65, respectively, the memory layer 62 and the tunnel insulating layer 61.

The non-volatile memory device according to an embodiment may further include the buffer layer 66. The buffer layer 66 may be located, at least one of; inside the tunnel insulating layer 61, inside the charge blocking layer 63, at the interface between the tunnel insulating layer 61 and the memory layer 62, and at the interface between the charge blocking layer 63 and the memory layer 62. In addition, the buffer layer 66 may include the second nanodots ND2.

As described above in the embodiments associated with, for example, FIGS. 5A to 5D, the memory layer 62 may comprise multiple layers while one of the multiple layers includes the first nanodots ND1, a barrier layer may be further included, symmetrical junctions or asymmetrical junctions may be included, any junction may not be included, and the charge blocking layer 63 may comprise multiple layers. Also, the embodiments associated with, for example, FIGS. 3A to 6B may be combined with each other.

A process of manufacturing the non-volatile memory device according to an embodiment associated with, for example, FIG. 6B will be described below.

After the plurality of interlayer insulating layers 67 and the plurality of sacrificial layers are formed alternately on the substrate, the plurality of interlayer insulating layers 67 and the plurality of sacrificial layers may be etched to form a trench, and the channel layer CH may be formed in the trench. Here, the interlayer insulating layer 67 may comprise an oxide layer, and the sacrificial layer may comprise a nitride layer. Subsequently, the plurality of interlayer insulating layers 67 and the plurality of sacrificial layers may be etched to form a slit between neighboring channel layers CH, and the plurality of sacrificial layers exposed through the slit may be recessed.

After the tunnel insulating layer 61, the buffer layer 66, the memory layer 62, the buffer layer 66, and the charge blocking layer 63 are formed sequentially along inner surfaces of recessed regions of the sacrificial layers, the word lines 65 may be formed by filling the recessed regions with conductive layers. In this manner, a three-dimensional structured non-volatile memory device including the nanodots may be manufactured.

Figure 6C:
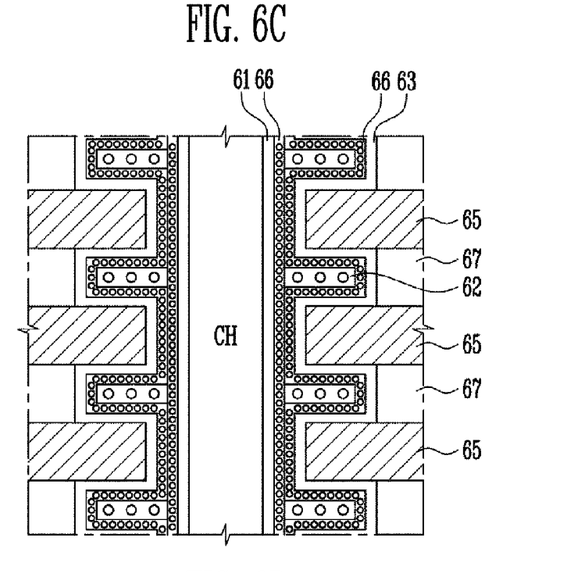
FIG. 6C is a cross-sectional view illustrating a structure of a non-volatile memory device according to an embodiment.

FIG. 6C is a cross-sectional view of a non-volatile memory device according to an embodiment. In FIG. 6C, a portion of a memory cell region is depicted for illustration purposes.

As illustrated in FIG. 6C, the non-volatile memory device according to an embodiment may include; the plurality of word lines 65 and the plurality of interlayer insulating layers 67 stacked alternately on a substrate (not illustrated), the channel layer CH passing through the plurality of word lines 65 and the plurality of interlayer insulating layers 67 and protruding from the substrate, the tunnel insulating layer 61 substantially surrounding the channel layer CH, the memory layer 62 interposed between the channel layer CH and the interlayer insulating layers 67, and the charge blocking layer 63 interposed between the memory layer 62 and the plurality of word lines 65. Here, the memory layer 62 may be formed of a floating gate.

The non-volatile memory device according to an embodiment may further include the buffer layer 66. The buffer layer 66 may be located, at least one of; inside the tunnel insulating layer 61, inside the charge blocking layer 63, at the interface between the tunnel insulating layer 61 and the memory layer 62, and at the interface between the charge blocking layer 63 and the memory layer 62. In addition, the buffer layer 66 may include the second nanodots ND2.

As described above in the embodiments associated with, for example, FIGS. 5A to 5D, the memory layer 62 may comprise multiple layers while one of the multiple layers may include; the first nanodots ND1, a barrier layer may be further included, symmetrical junctions or asymmetrical junctions may be included, any junction may not be included, or the charge blocking layer 63 may comprise multiple layers. The embodiments associated with, for example, FIGS. 5A to 5D and the embodiments associated with, for example, FIG. 6C may be combined with each other.

A process of manufacturing the non-volatile memory device according to an embodiment associated with FIG. 6C will be described below.

In an example, after the plurality of interlayer insulating layers 67 and the plurality of word lines 65 are formed alternately on the substrate, the plurality of interlayer insulating layers 67 and the plurality of word lines 65 may be etched to form a trench. Subsequently, the plurality of interlayer insulating layers 67 exposed along an inner wall of the trench may be recessed to a predetermined thickness, and the charge blocking layer 63 and the buffer layer 66 may be formed along the inner wall of the trench. Recessed regions may be filled with polysilicon layers to form the memory layers 62, that is, floating gates. Subsequently, after the buffer layer 66 and the tunnel insulating layer 61 may be formed sequentially on the inner wall of the trench on which the floating gates are formed, the channel layer CH may be formed on the tunnel insulating layer 61.

In another example, after the plurality of interlayer insulating layers 67 and the plurality of sacrificial layers are formed alternately on the substrate, the plurality of interlayer insulating layers 67 and the plurality of sacrificial layers may be etched to form a trench. Here, the sacrificial layer may comprise a nitride layer. Subsequently, like the above-described processes, after floating gates and the channel layer CH are formed, the plurality of interlayer insulating layers 67 and the plurality of sacrificial layers may be etched to form a slit between neighboring channel layers CH. After the plurality of sacrificial layers exposed through the slit are recessed, recessed regions may be filled with conductive layers to form the word lines 65, and an insulating layer is formed in the slit. In this manner, a three-dimensional structured non-volatile memory device including nanodots may be manufactured.

In yet another example, after the plurality of word lines 65 and the plurality of sacrificial layers are formed alternately on the substrate, the plurality of word lines 65 and the plurality of sacrificial layers may be etched to form a trench. Here, the word lines 65 each may be formed of a doped polysilicon layer doped with impurities such as boron (Br), and the sacrificial layer may be formed of an undoped polysilicon layer or an undoped amorphous silicon layer which is not doped with an impurity.

Subsequently, like the above-described processes, after floating gates and the channel layer CH are formed, the plurality of word lines 65 and the plurality of sacrificial layers may be etched to form a slit between neighboring channel layers CH. Next, the plurality of sacrificial layers exposed through the slit may be recessed. Subsequently, the interlayer insulating layers 67 may be formed in recessed regions of the plurality of sacrificial layers and the slit. In this manner, a three-dimensional structured non-volatile memory device including nanodots may be manufactured.

Figure 6D:
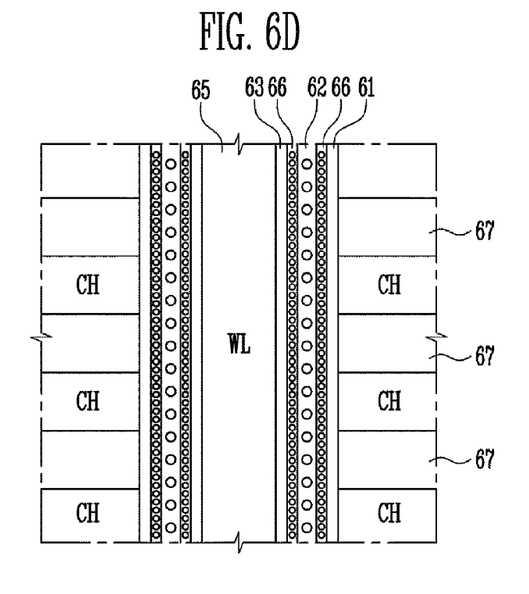
FIG. 6D is a cross-sectional view illustrating a structure of a non-volatile memory device according to an embodiment.

FIG. 6D is a cross-sectional view illustrating a structure of a non-volatile memory device according to an embodiment. In FIG. 6D, a portion of a memory cell region is depicted for illustration purposes.

As illustrated in FIG. 6D, the non-volatile memory device according to an embodiment may include; channel structures having a plurality of semiconductor layers and the plurality of interlayer insulating layers 67 alternately stacked one upon another; and the tunnel insulating layer 61, the memory layer 62, the charge blocking layer 63, and a conductive layer formed sequentially along sidewalls of the channel structures.

Here, the conductive layer may be in the form of a line extending in a predetermined direction and coming in contact with the sidewalls of the plurality of channel structures or in the form of a pillar formed between the channel structures. In addition, the conductive layer may be used as the word line (i.e., WL) 65, and the semiconductor layers may be used as the channel layers CH.

The non-volatile memory device may further include the buffer layer 66 that may be located, at least one of; inside the tunnel insulating layer 61, inside the charge blocking layer 63, at the interface between the tunnel insulating layer 61 and the memory layer 62, and at the interface between the charge blocking layer 63 and the memory layer 62. In addition, the buffer layer 66 may include the second nanodots ND2.

As described above in the embodiments associated with, for example, FIGS. 5A to 5D, the memory layer 62 may comprise multiple layers while at least one of the multiple layers includes; the first nanodots ND1, a barrier layer may further be included, symmetrical junctions or asymmetrical junctions may be included, any junction may not be included, and the charge blocking layer 63 may comprise multiple layers. One of the embodiments associated with, for example, FIGS. 3A to 6D or a combination thereof may be implemented.

A process of manufacturing the non-volatile memory device according to an embodiment associated, for example, with FIG. 6D will be described below.

First, after the plurality of interlayer insulating layers 67 and the plurality of channel layers CH are formed alternately on a substrate (not illustrated), the plurality of interlayer insulating layers 67 and the plurality of channel layers CH may be patterned to form channel structures. Subsequently, the tunnel insulating layer 61, the buffer layer 66, memory layer 62, the buffer layer 66, the charge blocking layer 63, and the word line 65 that protrude from the substrate may be formed along sidewalls of the channel structures. In this manner, a three-dimensional structured non-volatile memory device including nanodots may be manufactured.

Figure 7:
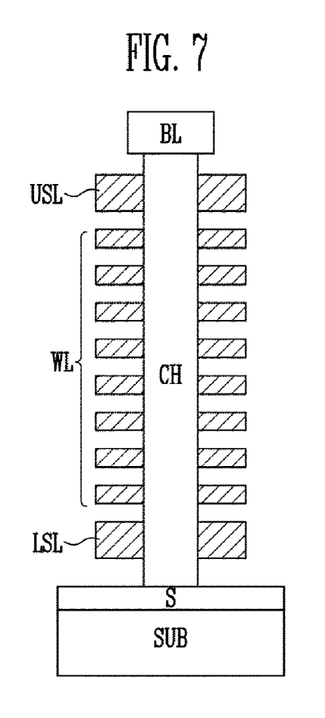
FIG. 7 is a cross-sectional view illustrating a structure of a non-volatile memory device according to an embodiment.

FIG. 7 is a cross-sectional view illustrating a structure of a non-volatile memory device according to an embodiment. In FIG. 7, gate lines are mainly depicted and other layers are not depicted for illustration purposes.

As illustrated in FIG. 7, the non-volatile memory device according to an embodiment may include the channel layer CH protruding from a substrate SUB including a source region S and a plurality of memory cells stacked along the channel layer CH. Specifically, the non-volatile memory device according to an embodiment may include a lower select line LSL, a plurality of word lines WL, and an upper select line USL stacked sequentially on the substrate SUB. Additionally, bit lines BL may be located over the upper select line USL and connected to the channel layer.

According to the above-described structure, a string may be arranged in substantially a vertical direction to the substrate SUB. Here, the memory cells may have a structure according to one of the embodiments associated with, for example, FIGS. 6A to 6C, or any suitable combination of these embodiments.

Figure 8:
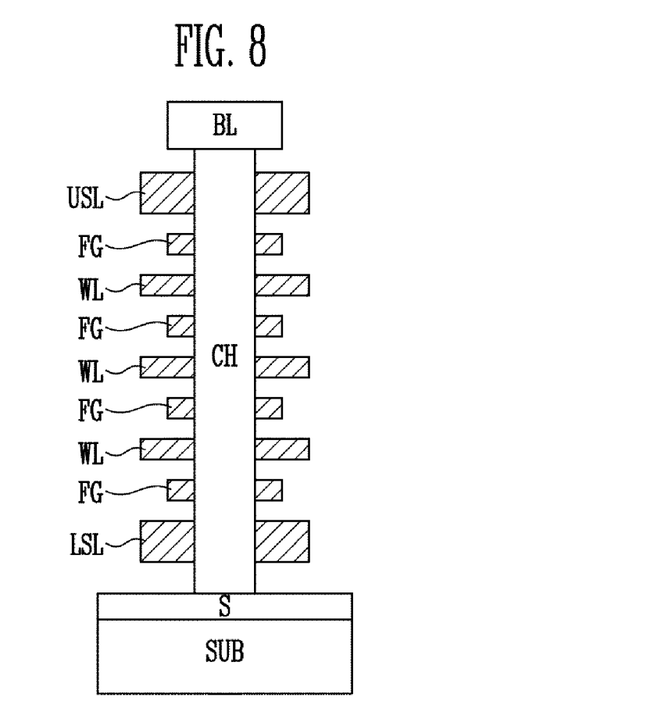
FIG. 8 is a cross-sectional view illustrating a structure of a non-volatile memory device according to an embodiment.

FIG. 8 is a cross-sectional view illustrating a structure of a non-volatile memory device according to an embodiment. In FIG. 8, gate lines are mainly depicted and other layers are not depicted for illustration purposes.

As illustrated in FIG. 8, the non-volatile memory device according to an embodiment may include the channel layer CH protruding from the substrate SUB including the source region S and a plurality of memory cells stacked along the channel layer CH. Additionally, the non-volatile memory device according to an embodiment may include; the lower select line LSL, the plurality of word lines WL, and the plurality of floating gates FG stacked alternately on the substrate SUB, and the upper select line USL.

With the above-described structure, one memory cell may have one floating gate FG and two control gates, and a string may be arranged in substantially a vertical direction to the substrate SUB. Here, the memory cells may have the same configuration as those of an embodiment associated with, for example, FIG. 6C.

Figure 9:
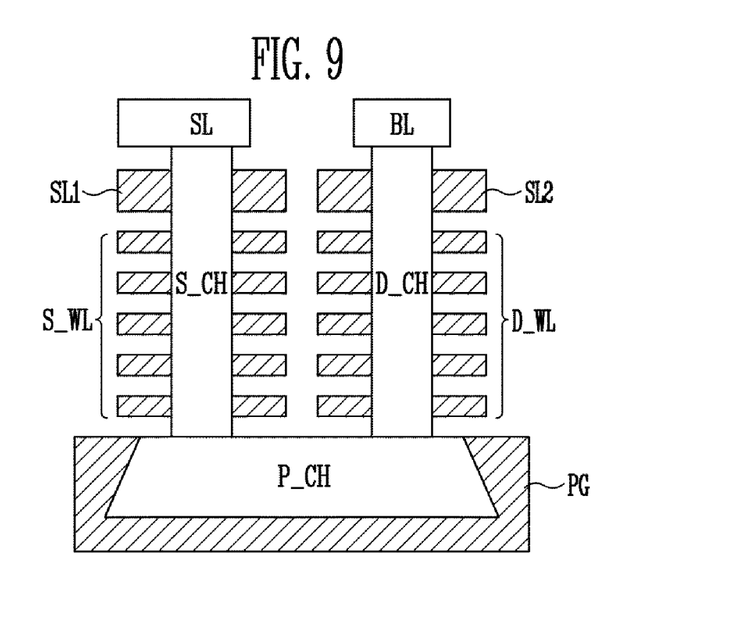
FIG. 9 is a cross-sectional view illustrating a structure of a non-volatile memory device according to an embodiment.

FIG. 9 is a cross-sectional view illustrating a structure of a non-volatile memory device according to an embodiment. In FIG. 9, gate lines are mainly depicted, and other layers are not depicted for illustration purposes.

As illustrated in FIG. 9, the non-volatile memory device according to an embodiment may include; a pipe gate PG, a plurality of source side word lines S_WL and a plurality of drain side word lines D_WL stacked on the pipe gate PG, and a first selection line SL1 formed over the source side word lines S_WL, and a second selection line SL2 formed over the drain side word lines D_WL. In addition, the non-volatile memory device according to an embodiment may include a pipe channel layer P_CH formed in the pipe gate PG, a channel layer comprising a pair of a source side channel layer S_CH, and a drain side channel layer D_CH coupled to the pipe channel layer P_CH. Here, the source side channel layer S_CH protrudes from a substrate and passes through the plurality of source side word lines S_WL, and the drain side channel layer D_CH protrudes from the substrate and passes through the plurality of drain side word lines D_WL. Additionally, source lines SL may be located over the first selection line SL1 and connected to the source side channel layer S_CH, and bit lines may be located over the second selection line SL2 and connected to the drain side channel layer D_CH.

According to the above-described structure, a substantially U-shaped string is arranged on the substrate. Here, each of the memory cells may have a configuration by using, for example, one of the embodiments associated with FIGS. 6A to 6C, or any suitable combination of these embodiments.

Figure 10:
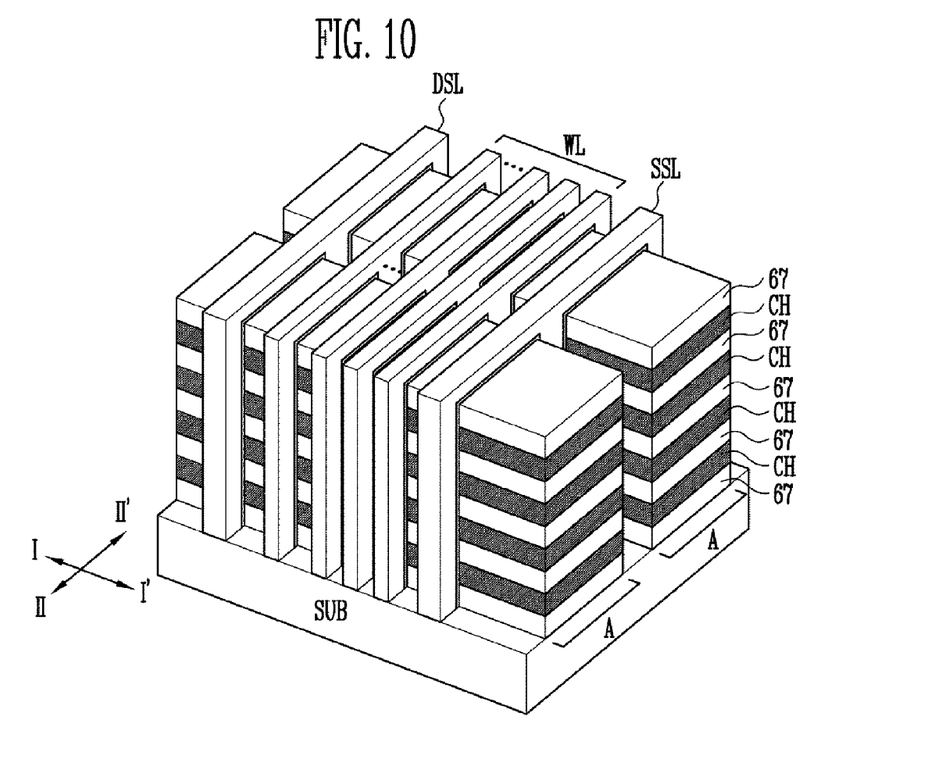
FIG. 10 is a cross-sectional view illustrating a structure of a non-volatile memory device according to an embodiment.

FIG. 10 is a cross-sectional view illustrating a structure of a non-volatile memory device according to an embodiment.

As illustrated in FIG. 10, the non-volatile memory device according to an embodiment may include the plurality of channel layers CH and the plurality of interlayer insulating layers 67 stacked alternately on the substrate SUB, and a plurality of channel structures A extending in a first direction I-I' and arranged in parallel with each other. The non-volatile memory device according to an embodiment associated with, for example, FIG. 10 further includes the plurality of word lines WL extending in a second direction II-II', arranged in parallel with each other, and formed along sidewalls of the channel structures; a drain selection line DSL formed at one side of the word lines WL; and a source selection line SSL formed at the other side of the word lines WL.

According to the above-described structure, strings may be arranged substantially in a horizontal direction to the substrate SUB. The above-described structure has a plurality of strings stacked one upon another. Here, the memory cells may have substantially the same structure as those described in the embodiments associated with, for example, FIG. 6D.

Figure 11:
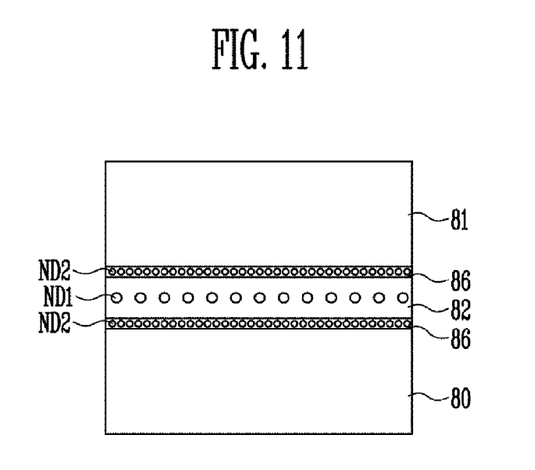
FIG. 11 is a cross-sectional view illustrating a structure of a capacitor according to an embodiment.

FIG. 11 is a cross-sectional view illustrating a structure of a capacitor according to an embodiment.

As illustrated in FIG. 11, the capacitor according to an embodiment may include; a lower electrode 80, an upper electrode 81 and a dielectric layer 82 interposed between the upper electrode 81 and the lower electrode 80, and including the first nanodots ND1. In addition, the capacitor according to the embodiment may include the buffer layer 86. The buffer layer 86 may be located, at least one of, at the interface between the lower electrode 80 and the dielectric layer 82, and at the interface between the upper electrode 81 and the dielectric layer 82. In addition, the buffer layer 86 may include the second nanodots ND2.

According to the above-described structure, the buffer layer 86 may be included in the capacitor, so that charges stored in the dielectric layer 82 may be blocked from being drained off under at least one of low-field conditions and high-field conditions.

Figure 12:
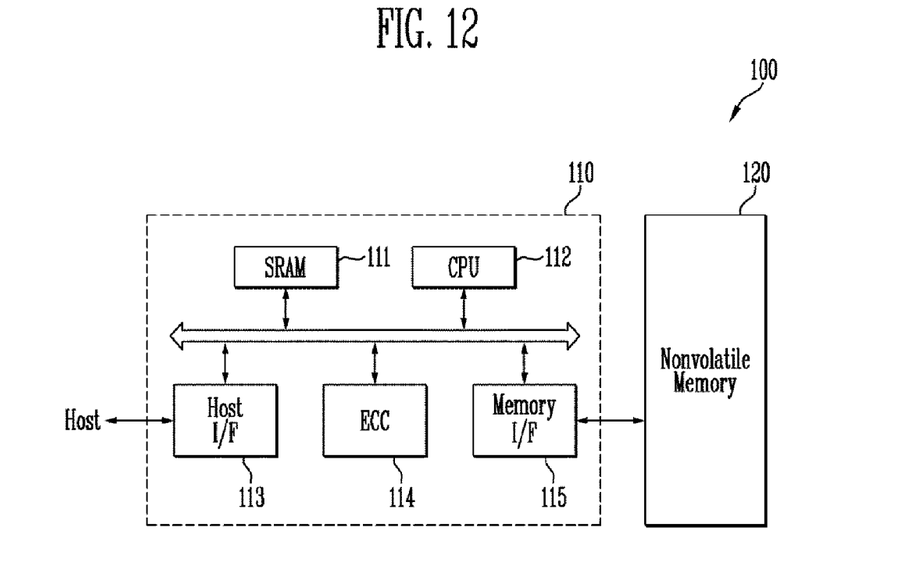
FIG. 12 is a view illustrating the configuration of a non-volatile memory device according to an embodiment.

FIG. 12 is a view illustrating the configuration of a memory system.

As illustrated in FIG. 12, a memory system 100 according to an embodiment may include a non-volatile memory device 120 and a memory controller 110.

The non-volatile memory device 120 may be formed to have the above-described configurations according to embodiments associated with, for example, FIGS. 2A to 11. In addition, the non-volatile memory device 120 may be a multi-chip package including a plurality of flash memory chips.

The memory controller 110 may be configured to control the non-volatile memory device 120. The memory controller 110 may include an SRAM 111, a CPU 112, a host interface 113, an ECC 114, and a memory interface 115. The SRAM 111 may be used as an operating memory of the CPU 112. The CPU 112 may perform the general control operation for data exchange of the memory controller 110. The host interface 113 may include a data exchange protocol corresponding to a host coupled to the memory system 100. In addition, the ECC 114 may detect and correct an error in data read from the non-volatile memory device 120. The memory interface 115 may interface the memory controller 110 with the non-volatile memory device 120. In addition, the memory controller 110 may further include RCM for storing code data for an interface with the host.

The memory system 100 having the above-described configuration may be a memory card or a Solid State Disk (SSD) in which the non-volatile memory device 120 and the controller 110 are combined with each other. For example, if the memory system 100 is an SSD, the memory controller 110 may communicate with the outside (e.g., a host) through one of various interface protocols, such as USB, MMC, PCI-E, SATA, PATA, SCSI, ESDI, and IDE.

Figure 13:
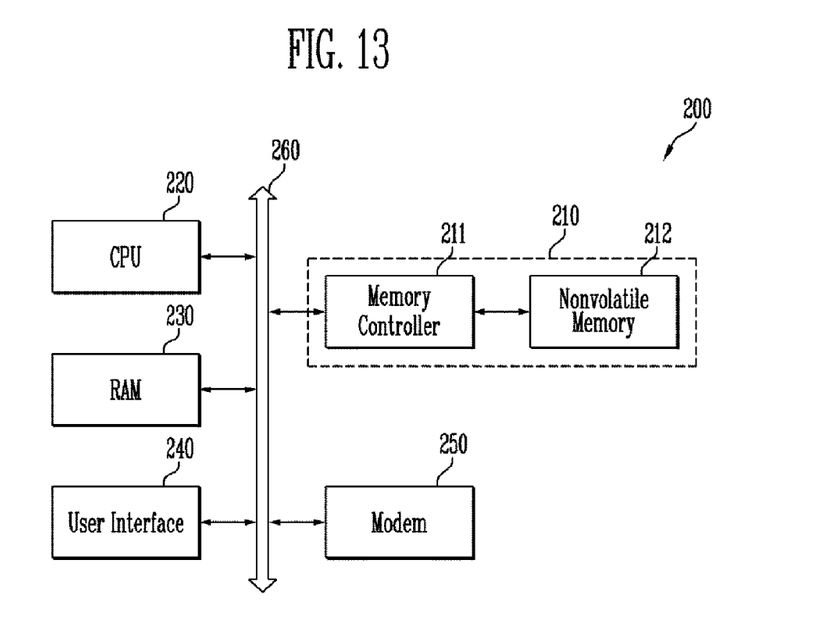
FIG. 13 is a view illustrating the configuration of a computing system according to an embodiment.

FIG. 13 is a view illustrating the configuration of a computing system according to an embodiment.

As illustrated in FIG. 13, a computing system 200 according to an embodiment may include a CPU 220, RAM 230, a user interface 240, a modem 250, and a memory system 210 that may be electrically coupled to a system bus 260. When the computing system 200 is a mobile device, the computing system 200 may further include a battery for supplying an operating voltage to the computing system 200. The computing system 200 may further include application chipsets, a Camera Image Processor (CIS), and a mobile DRAM.

As described above in connection with FIG. 12, the memory system 210 may include a non-volatile memory 212 and a memory controller 211.

According to an embodiment, a semiconductor may comprise a memory layer including first nanodots and a buffer layer including second nanodots. Additionally, charges stored in the memory layer may be blocked from being drained off under low-field conditions such as a retention mode by locating the buffer layer inside a tunnel insulating layer or at the interface between the tunnel insulating layer and the memory layer. In addition, charges may be blocked from being drained off or moving from a control gate electrode under high-field conditions such as a program operation or an erase operation or low-field conditions such as a retention mode.

In addition, according to an embodiment, a capacitor may comprise a dielectric layer including first nanodots and a buffer layer including second nanodots. Additionally, charges stored in the capacitor may be blocked from being drained off by interposing the buffer layer at the interface between the dielectric layer and an upper electrode or at the interface between the dielectric layer and a lower electrode.

What is claimed is:

1. A semiconductor device, comprising:
a channel layer;
a tunnel insulating layer formed on the channel layer;
a memory layer formed on the tunnel insulating layer and including first nanodots;
a charge blocking layer formed on the memory layer;
a gate electrode conductive layer formed on the charge blocking layer; and
a buffer layer located, at least one of, inside the tunnel insulating layer, inside the charge blocking layer, at an interface between the tunnel insulating layer and the memory layer, and at the interface between the charge blocking layer and the memory layer,
wherein the buffer layer includes second nanodots, and
the buffer layer, located, at least one of, inside the tunnel insulating layer and at the interface between the tunnel insulating layer and the memory layer, blocks a movement of charges under a low-field condition.

2. The semiconductor device of claim 1, wherein the memory layer is a floating gate.

3. The semiconductor device of claim 1, wherein the buffer layer, located, at least one of, inside the charge blocking layer and at the interface between the charge blocking layer and the memory layer, blocks a movement of charges under a high-field condition and a low-field condition.

4. The semiconductor device of claim 1, wherein each of the second nanodots has a smaller size than each of the first nanodots.

5. The semiconductor device of claim 1, wherein each of the first nanodots has a diameter ranging from about 1 to 10 nm.

6. The semiconductor device of claim 1, wherein each of the second nanodots has a diameter ranging from about 0.1 to 3 nm.

7. The semiconductor device of claim 1, wherein the first nanodots and the second nanodots are formed of one of a semiconductor, a metal oxide, a metal, and a silicide, or any suitable combination of these materials.

8. The semiconductor device of claim 1, wherein the tunnel insulating layer is formed of one of $SiO_2$, $Si_xN_y$, a metal oxide, and a high-k material, or any suitable combination of these materials.

9. The semiconductor device of claim 1, wherein the memory layer is formed of one of polysilicon, $Si_xN_y$, a metal oxide, and a high-k material, or any suitable combination of these materials.

10. The semiconductor device of claim 1, wherein the memory layer comprises a plurality of layers stacked, and at least one of the plurality of layers includes the first nanodots.

11. The semiconductor device of claim 1, wherein the memory layer comprises:
a nitride layer having a high silicon content (Si-Rich Nitride); and a silicon nitride (SiN) layer formed on a nitride layer having the high silicon content (Si-Rich Nitride), and including the second nanodots.

12. The semiconductor device of claim 1, wherein the charge blocking layer is formed of one of SiO2, SixNy, a metal oxide, and a high-k material, or any suitable combination of these materials.

13. The semiconductor device of claim 1, wherein the charge blocking layer comprises a SiN layer.

14. The semiconductor device of claim 1, further comprising a barrier layer interposed between the charge blocking layer and the gate electrode conductive layer.

15. A semiconductor device, comprising:
conductive layers and interlayer insulating layers stacked alternately on a substrate;
semiconductor pillars protruding from the substrate and passing through the conductive layers and interlayer insulating layers;
a memory layer substantially surrounding sidewalls of the semiconductor pillars and including first nanodots;
a tunnel insulating layer interposed between the semiconductor pillars and the memory layer;
a charge blocking layer interposed between the memory layer and the conductive layers; and
a buffer layer located, at least one of, inside the tunnel insulating layer, inside the charge blocking layer, at the interface between the tunnel insulating layer and the memory layer, and at the interface between the charge blocking layer and the memory layer,
wherein the buffer layer includes second nanodots.

16. The semiconductor device of claim 15, wherein the memory layer is a floating gate and is interposed between the interlayer insulating layers and the semiconductor pillars.

17. The semiconductor device of claim 15, further comprising:
a pipe gate formed under the conductive layers; and
a pipe channel layer formed in the pipe gate and coupled to a pair of the semiconductor pillars.

18. A semiconductor device, comprising:
a channel structure including semiconductor layers and interlayer insulating layers stacked alternately;
a memory layer formed substantially on sidewalls of the channel structure and including first nanodots;
a conductive layer formed on the memory layer;
a tunnel insulating layer interposed between the sidewalls of the channel structure and the memory layer;
a charge blocking layer interposed between the memory layer and the conductive layer; and
a buffer layer located, at least one of, inside the tunnel insulating layer, inside the charge blocking layer, at an interface between the tunnel insulating layer and the memory layer, and at an interface between the charge blocking layer and the memory layer,
wherein the buffer layer includes second nanodots.

19. A capacitor, comprising:
an upper electrode;
a lower electrode;
a dielectric layer interposed between the upper electrode and the lower electrode and including first nanodots; and
a buffer layer located, at least one of, at an interface between the lower electrode and the dielectric layer, and at an interface between the upper electrode and the dielectric layer,
wherein the buffer layer includes second nanodots.

* * * * *